United States Patent
Li et al.

(10) Patent No.: US 11,765,873 B2
(45) Date of Patent: Sep. 19, 2023

(54) ELECTROMAGNETIC SHIELDING FILM, FLEXIBLE CIRCUIT BOARD AND DISPLAY DEVICE

(71) Applicant: BOE TECHNOLOGY GROUP CO., LTD., Beijing (CN)

(72) Inventors: Yuanyuan Li, Beijing (CN); Meizhu Zheng, Beijing (CN); Jiuzhen Wang, Beijing (CN); Dalin Xiang, Beijing (CN); Lina Liu, Beijing (CN); Zewen Bo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 141 days.

(21) Appl. No.: 17/425,991

(22) PCT Filed: Aug. 26, 2020

(86) PCT No.: PCT/CN2020/111298
§ 371 (c)(1),
(2) Date: Jul. 28, 2021

(87) PCT Pub. No.: WO2022/040968
PCT Pub. Date: Mar. 3, 2022

(65) Prior Publication Data
US 2022/0322586 A1  Oct. 6, 2022

(51) Int. Cl.
*H05K 1/18* (2006.01)
*H05K 9/00* (2006.01)
*H05K 1/02* (2006.01)

(52) U.S. Cl.
CPC .......... *H05K 9/0081* (2013.01); *H05K 1/028* (2013.01); *H05K 1/0216* (2013.01); *H05K 2201/10128* (2013.01)

(58) Field of Classification Search
CPC .... H05K 9/0081; H05K 1/0216; H05K 1/028; H05K 2201/10128
(Continued)

(56) References Cited

U.S. PATENT DOCUMENTS 10,863,619 B2    12/2020   Lee et al.
2009/0135568 A1*  5/2009   Jeong ..................... H05K 1/147
                                                              361/749
(Continued)

FOREIGN PATENT DOCUMENTS

CN          2569515 Y      8/2003
CN        201282594 Y      7/2009
(Continued)

OTHER PUBLICATIONS

Written Opinion from PCT/CN2020/111298 dated Jun. 6, 2021.

*Primary Examiner* — Binh B Tran
(74) *Attorney, Agent, or Firm* — Calfee, Halter & Griswold LLP

(57) ABSTRACT

The present disclosure provides an electromagnetic shielding film, a flexible circuit board and a display device. The electromagnetic shielding film includes a central portion and an edge portion. The central portion has a plurality of surrounding side edges; and the edge portion is provided on at least one side edge of the central portion, and includes a plurality of protruding units protruding away from the central portion. The plurality of protruding units are arranged in an extending direction of the side edge where the edge portion is located. The electromagnetic shielding film is used to attach on a flexible circuit board body, the central portion is located on a non-bending area, and the edge portion is located on a bending area, so that the flexible circuit board is formed.

20 Claims, 5 Drawing Sheets

(58) Field of Classification Search
USPC .......................................................... 361/749
See application file for complete search history.

(56) References Cited

U.S. PATENT DOCUMENTS

| | | | |
|---|---|---|---|
| 2014/0048310 A1* | 2/2014 | Montevirgen | H05K 3/363 |
| | | | 174/250 |
| 2016/0056091 A1* | 2/2016 | Kim | H01L 23/49844 |
| | | | 257/773 |
| 2016/0306224 A1* | 10/2016 | Ishikawa | G02F 1/133308 |
| 2019/0373719 A1 | 12/2019 | Lee et al. | |

FOREIGN PATENT DOCUMENTS

| | | |
|---|---|---|
| CN | 101626676 A | 1/2010 |
| CN | 102378470 A | 3/2012 |
| CN | 101626676 B | 1/2013 |
| JP | 2019169484 A | 10/2019 |

\* cited by examiner

ELECTROMAGNETIC SHIELDING FILM, FLEXIBLE CIRCUIT BOARD AND DISPLAY DEVICE

CROSS-REFERENCE TO RELATED APPLICATIONS

The present application is based upon International Application No. PCT/CN2020/111298 filed on Aug. 26, 2020, the entire contents of which are incorporated herein by reference.

TECHNICAL FIELD

The present disclosure relates to the field of display technology, and more specifically, to an electromagnetic shielding film, a flexible circuit board and a display device.

BACKGROUND

In order to increase a screen-to-body ratio of a display panel, a driving chip for driving the display panel to display is usually bound to a flexible printed circuit (FPC), and then the flexible circuit board is bent to a backlight side of the display panel. In this way, the driving chip is fixed on the backlight side of the display panel to increase the screen-to-body ratio of the display panel. This requires that the flexible circuit board not only has a good electrical property, but also has an excellent bending property.

In order to protect circuits in the flexible circuit board from being affected by outside (strong electromagnetic area or vulnerable area), an electromagnetic shielding film is usually attached to the flexible circuit board. The electromagnetic shielding film often needs to cover a larger area in order to achieve a better shielding effect, therefore, the edge of the electromagnetic shielding film would be located in a bending area of the flexible circuit board. However, since the electromagnetic shielding film has a large thick thickness, when the overall structure of the flexible circuit board is bent, the bending area has a serious stress concentration, and thus intends to incur breakage. If the electromagnetic shielding film is provided only on the non-bending area, the shielding effect would be reduced.

It should be noted that the information of the present invention in the background art section above is only used to enhance the understanding of the background of the present disclosure, and therefore may include information that does not constitute the prior art known to those skilled in the art.

SUMMARY

The present disclosure is to provide an electromagnetic shielding film, a flexible circuit board and a display device.

A first aspect of the present disclosure provides an electromagnetic shielding film, including:

a central portion, having a plurality of surrounding side edges; and an edge portion, provided on at least one side edge of the central portion, and including a plurality of protruding units protruding away from the central portion, the plurality of protruding units being arranged in an extending direction of the side edge where the edge portion is located.

In an exemplary embodiment of the present disclosure, the central portion includes a first side edge and a second side edge, and the electromagnetic shielding film includes a first edge portion and a second edge portion; the first edge portion is located on the first side edge and includes a plurality of first protruding units protruding away from the central portion, and the plurality of first protruding units are arranged in an extending direction of the first side edge; and the second edge portion is located on the second side and includes a plurality of second protruding units protruding away from the central portion, and the plurality of second protruding units are arranged in an extending direction of the second side edge.

In an exemplary embodiment of the present disclosure, shapes or areas of the plurality of first protruding units are same or different from each other, and shapes or areas of the plurality of second protruding units are same or different from each other, and the first protruding unit has a same shape or area as or a different shape or area from that of the second protruding unit.

In an exemplary embodiment of the present disclosure, the first protruding unit and the second protruding unit have a shape of a rectangle, a triangle, a semicircle, or a semiellipse.

In an exemplary embodiment of the present disclosure, the central portion of the electromagnetic shielding film has a rectangular shape, and the first side edge and the second side edge are arranged opposite to each other.

A second aspect of the present disclosure provides a flexible circuit board, including:

a flexible circuit board body, including a non-bending area and a bending area located on at least one side edge of the non-bending area; and at least one of the electromagnetic shielding film described above, covering the flexible circuit board body, wherein the central portion of the electromagnetic shielding film is located on the non-bending area, and the edge portion of the electromagnetic shielding film is located on the bending area, and has an interval from a bending axis of the bending area.

In an exemplary embodiment of the present disclosure, the central portion of the electromagnetic shielding film includes a first side edge and a second side edge, and the electromagnetic shielding film includes a first edge portion and a second edge portion; the first edge portion is located on the first side edge and includes a plurality of first protruding units protruding away from the central portion, and the plurality of first protruding units are arranged in an extending direction of the first side edge; the second edge portion is located on the second side edge and includes a plurality of second protruding units protruding away from the central portion, and the plurality of second protruding units are arranged in an extending direction of the second side edge; and the flexible circuit board body includes a first bending area at a side of the non-bending area and a second bending area at another side of the non-bending area, and the central portion of the electromagnetic shielding film is located on the non-bending area of the flexible circuit board body; the first edge portion of the electromagnetic shielding film is located on the first bending area of the flexible circuit board body and has an interval from a bending axis of the first bending area; and the second edge portion of the electromagnetic shielding film is located on the second bending area of the flexible circuit board body and has an interval from a bending axis of the second bending area.

In an exemplary embodiment of the present disclosure, the flexible circuit board includes two electromagnetic shielding films that respectively are a first electromagnetic shielding film and a second electromagnetic shielding film, the flexible circuit board body includes a first surface and a second surface opposite to each other, the first electromagnetic shielding film covers the first surface of the flexible circuit board body, and the second electromagnetic shielding film covers the second surface of the flexible circuit board body; and the central portions of the first electromagnetic shielding film and the second electromagnetic shielding film are both located on the non-bending area of the flexible circuit board body, the first edge portions of the first electromagnetic shielding film and the second electromagnetic shielding film are both located on the first bending area and have an interval from a bending axis of the first bending area, and the second edge portions of the first electromagnetic shielding film and the second electromagnetic shielding film are both located on the second bending area and have an interval from a bending axis of the second bending area.

In an exemplary embodiment of the present disclosure, a projection of the first edge portion of the first electromagnetic shielding film on the flexible circuit board body does not overlap with a projection of the first edge portion of the second electromagnetic shielding film on the flexible circuit board body, and/or a projection of the second edge portion of the first electromagnetic shielding film on the flexible circuit board body does not overlap with a projection of the second edge portion of the second electromagnetic shielding film on the flexible circuit board body.

In an exemplary embodiment of the present disclosure, the non-bending area of the flexible circuit board body, the central portion of the first electromagnetic shielding film, and the central portion of the second electromagnetic shielding portion have a rectangular shape, the first bending area and the second bending area are arranged oppositely, and the first side edge and the second side edge are arranged oppositely.

In an exemplary embodiment of the present disclosure, the first edge portions of the first electromagnetic shielding film and the second electromagnetic shielding film have a same shape and size, and the second edge portions of the first electromagnetic shielding film and the second electromagnetic shielding film have a same shape and size.

A third aspect of the present disclosure provides a display device including the flexible circuit board described above.

It should be understood that the above general description and the following detailed description are only exemplary and explanatory, and cannot limit the present disclosure.

BRIEF DESCRIPTION OF THE DRAWINGS

The drawings herein are incorporated into the specification and constitute a part of the specification, show embodiments in accordance with the present disclosure, and are used, together with the specification, to explain the principle of the present disclosure. Obviously, the drawings in the following description are only some embodiments of the present disclosure. For those skilled in the art, other drawings may be obtained based on these drawings without creative work.

DETAILED DESCRIPTION

Figure 1:
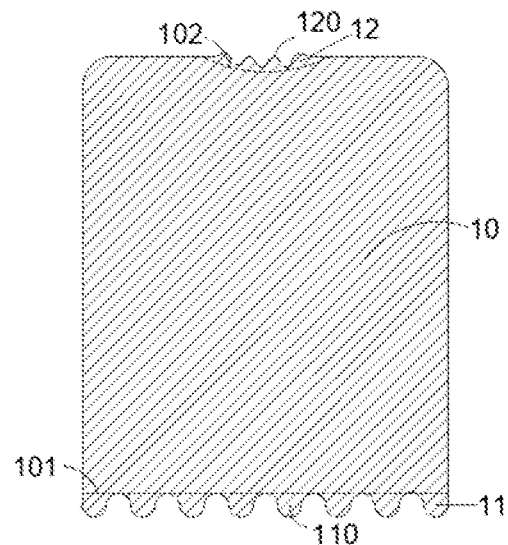
FIG. 1 is a schematic diagram of a structure of an electromagnetic shielding film according to an embodiment of the present disclosure.

Example embodiments will now be described more fully with reference to the accompanying drawings. However, the example embodiments may be implemented in various forms, and should not be construed as being limited to the embodiments set forth herein; on the contrary, these embodiments are provided so that the present disclosure will be comprehensive and complete, and the concept of the example embodiments will be fully conveyed to those skilled in the art. The same reference numerals in the figures indicate the same or similar structures, and thus their detailed descriptions will be omitted.

An electromagnetic shielding film usually has a sandwich structure of "insulating layer-metal shielding layer-conductive adhesive layer". The electromagnetic shielding film is adhered to the flexible circuit board body through the conductive adhesive layer to shield electromagnetic waves. The electromagnetic shielding film has a relatively large thickness, and the metal shielding layer thereof includes a material having a relatively large rigidity, therefore a strong stress will be generated when the flexible circuit board body is bent. Since the electromagnetic shielding film is adhered to the flexible circuit board body, the stress generated by the electromagnetic shielding film will have impact on the flexible circuit board body, causing the flexible circuit board body to be easily broken at the edge of the electromagnetic shielding film.

An embodiment of the present disclosure provides an electromagnetic shielding film. As shown in FIG. 1, the electromagnetic shielding film in the embodiment of the present disclosure includes a central portion 10 and an edge portion. The central portion 10 and the edge portion are divided by a dotted line in the figure. The central portion 10 has a plurality of surrounding side edges, the edge portion is provided on at least one side edge of the central portion 10, the edge portion includes a plurality of independent protruding units protruding away from the central portion 10, and the plurality of protruding units are arranged in an extending direction of the side edge.

It should be noted that this dividing manner is only an example, and the dotted line may also move upward, that is, the edge portion may also include a partially continuous structure. For easier description, the embodiment is described by taking the dividing manner shown in the figure as an example.

Figure 2:
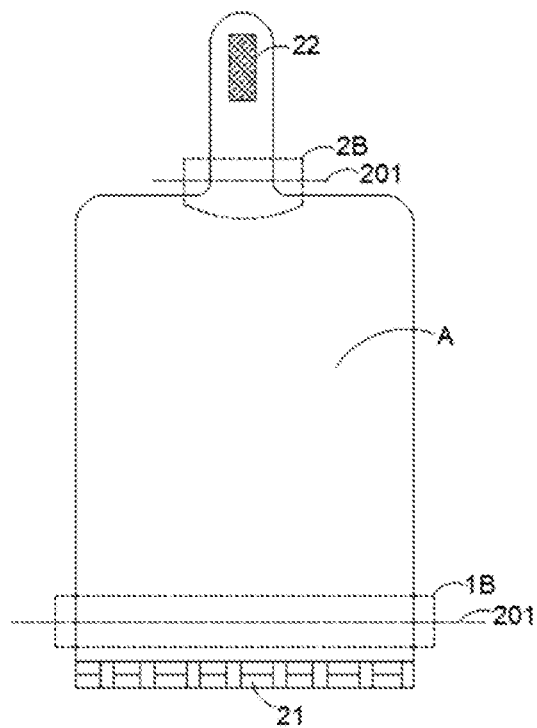
FIG. 2 is a schematic diagram of a structure of a flexible circuit board body according to an embodiment of the present disclosure.

The electromagnetic shielding film is used to be attached to a flexible circuit board body. As shown in FIG. 2, the flexible circuit board body 2 includes a non-bending area A and a bending area located at a side of the non-bending area A. The non-bending area A and the bending area is divided according to a state of the flexible circuit board body 2 when the flexible circuit board body 2 is bent. The non-bending area A refers to an area that is not bent when the flexible circuit board body 2 is bent, and the bending area refers to an area that is bent. It should be noted that the non-bending area A and the bending area is not divided based on bendability, that is, the non-bending area A may also be bendable but is not bent when being used, and the bending area may be in an unbent state when no bending is required.

Figure 3:
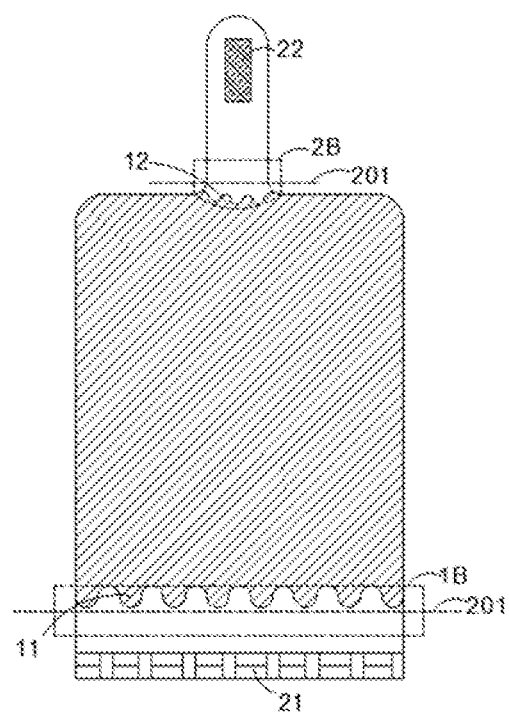
FIG. 3 is a schematic diagram of a structure of a flexible circuit board according to an embodiment of the present disclosure.
Figure 4:
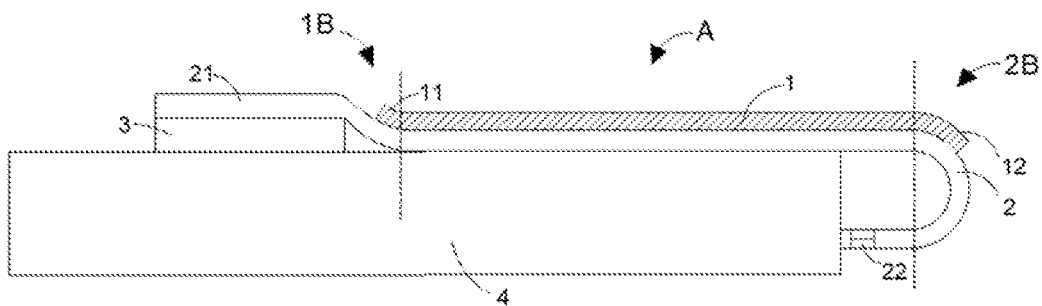
FIG. 4 is a schematic cross-sectional view of a flexible circuit board after being bended according to an embodiment of the present disclosure.

An area of the flexible circuit board body 2, such as a binding area 21 connected to a driving chip 3 or a connector 22 connected to a display panel 4, may be bent so that a main structure of the flexible circuit board is located on a back of the display panel 4 and the driving chip 3 connected thereto is fixed on the back of the display panel. As shown in FIG. 2, an area being bent is defined as the bending area, a bending axis 201 extends in a horizontal direction in the figure, a bending direction of the bending area may be upward or downward, and another area not being bent is defined as non-bending area A. When the electromagnetic shielding film 1 is attached, the central portion 10 of the electromagnetic shielding film 1 is attached to the non-bending area A of the flexible circuit board body 2, and the edge portion is located in the bending area, as shown in FIGS. 3 and 4. When the entire structure of the flexible circuit board is bent along the bending axis 201, since the edge portion of the electromagnetic shielding film 1 has the plurality of protruding units, the plurality of protruding units forms a non-straight edge which, in comparison to a straight edge, may disperse the stress generated at the bending area in a plurality of directions, reducing the influence of the stress at the bending area on the flexible circuit board body, and thus reducing breaking risk of the flexible circuit board body when being bent at the bending area. At the same time, the edge portion of the electromagnetic shielding film can also cover the area of the flexible circuit board body to the greatest extent, which can ensure a better shielding effect. The non-straight edge of the electromagnetic shielding film 1 may be made by mechanical means such as shearing, which has a simple manufacturing method.

The electromagnetic shielding film and the flexible circuit board body in an embodiment of the present disclosure are respectively described in detail below.

The flexible circuit board body refers to an overall structure including a flexible substrate and a circuit and an electrical element provided on the flexible substrate. By taking the flexible circuit board body 2 shown in FIG. 3 as an example, the flexible circuit board body 2 includes at least the non-bending area A, a first bending area 1B at a side of the non-bending area A, and a second bending area 2B at another side of the non-bending area A. The first bending area 1B may be an area that is bent near the binding area 21 connected to the driving chip 3, and the second bending area 2B may be the connector 22 connected to the display panel 4.

In the exemplary embodiment, as shown in FIGS. 1 to 3, the non-bending area A of the flexible circuit board body 2 has a rectangular shape, and correspondingly, the central portion 10 of the electromagnetic shielding film also has a rectangular shape. The non-bending area A and the central portion 10 have substantially the same shape and area, so that the electromagnetic shielding film 1 may cover the flexible circuit board body 2 as much as possible. The central portion 10 of the electromagnetic shielding film has four side edges. A first side edge 101 is a horizontal side edge in the lower part of the figure, and a first edge portion 11 is located on the first side edge 101. Each of the first protruding units 110 of the first edge portion 11 is protruded downward, and the plurality of first protruding units 110 are arranged in a horizontal direction.

Figure 5:
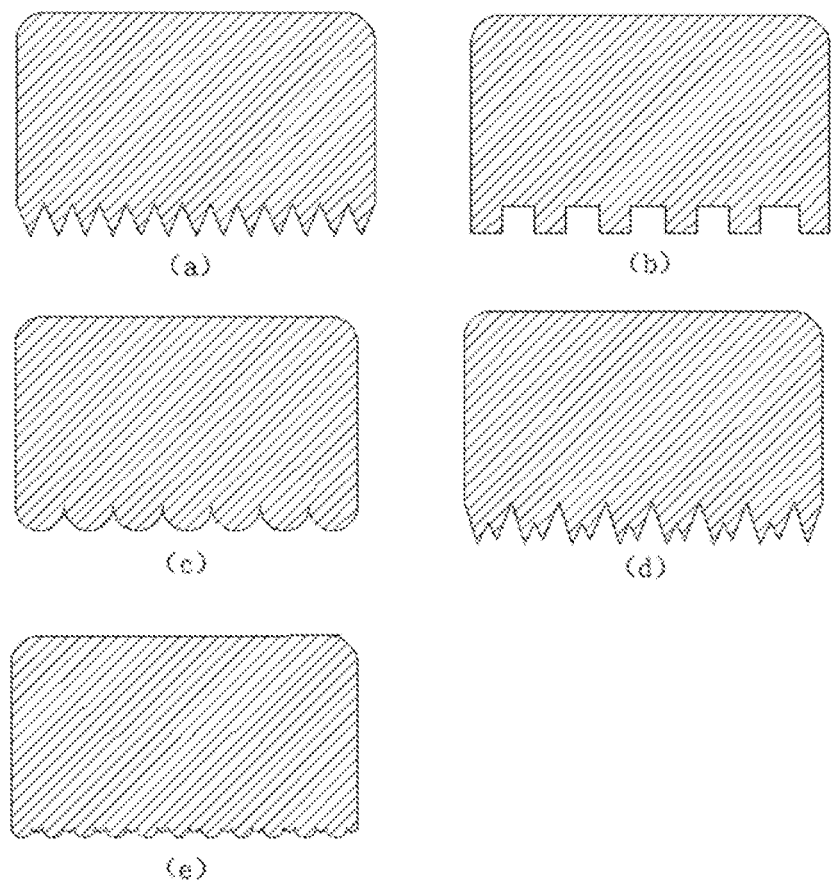
FIG. 5 is a schematic diagram of a shape of a protruding unit of an electromagnetic shielding film according to an embodiment of the present disclosure.

The first protruding unit 110 may have any regular or irregular shape such as a rectangle, a triangle, a semicircle, or a semiellipse. FIG. 5 exemplarily shows several first edge portions 11 with different shapes. As shown in FIGS. 5(a)-5(c), the shapes of the first protruding units 110 are the same, and as shown in FIGS. 5(d)-5(e), the shapes of the first protruding units 110 may also be different. At the same time, as shown in FIGS. 5(a)-5(c), the areas of the first protruding units 110 are same, as shown in FIGS. 5(d)-5(e), the areas of the first protruding units 110 may also be different. By taking FIG. 5(b) as an example, there is an interval between the rectangular first protruding units 110, that is, the first protruding units 110 are not connected to each other. By taking FIG. 5(a) as an example, the triangular first protruding units 110 are connected to each other. The shape of the first protruding unit 110 is preferably rectangular, triangular, semi-circular or semi-elliptical, and these shapes have regular edges and thus are easy to be manufactured.

It should be noted that the first protruding unit 110 may be divided in various forms. By taking FIG. 5(d) as an example, the entire first edge portion 11 has a peak shape, and each peak may be regarded as one first protruding unit 110, and then the shape and area of a first protruding unit 110 are not the same as that of an adjacent first protruding unit 110. Further, the entirety of two adjacent higher and lower peaks may be regarded as one first protruding unit 110, and then the shape and area of a first protruding unit 110 are the same as that of an adjacent first protruding unit 110.

As shown in FIGS. 2 and 3, the central portion 10 of the electromagnetic shielding film further has a second side edge 102, which is an upper side edge opposite to the first side edge 101 and is different from the first side edge 101 in that the second side edge 102 has an arc-shaped portion recessed inward. The electromagnetic shielding film 1 further includes a second edge portion 12 corresponding to the second bending area 2B. The second edge portion 12 is located on the second side edge 102, and includes a plurality of second protruding units 120 protruding away from the central portion 10. Different from the first edge portion 11, the plurality of second protruding units 120 of the second edge portion are arranged in a curved direction in which the arc-shaped second side edge 102 extends, that is, the plurality of second protruding units 120 are arc-shaped as a whole. This is because the connector 22 is bent more seriously, which will cause the edge of the flexible circuit board body 2 connected thereto to be bent, so that the edge of the second bending area 2B is arc-shaped, that is, a part of the second side edge 102 is arc-shaped. Therefore, the second edge portion 12 is arranged into a corresponding arc shape, which may reduce breaking risk of the flexible circuit board body 2 at that position. The arc-shaped second edge portion 12 shown in the figure is only an example, and the specific arc or position thereof may be designed according to the actual situation of the second bending area 2B. It can be understood that the actual shape or size width of the second edge portion 12 may be adjusted according to the area and size of the second bending area. In another embodiment, the second side edge 102 may also be straight, and the second edge portion 12 as a whole correspondingly extends in a horizontal direction.

The specific shape of the second protruding unit 120 in the second edge portion may refer to that of the first protruding unit 110, which will not be repeated here. It can be understood that when the entire second edge portion 12 has the arc shape as shown in the figure, the edge of the second protruding unit 120 also has a certain arc correspondingly. Since the area of the second edge portion 12 is relatively small, the area of the second protruding unit 120 may also be correspondingly arranged to be relatively small, so that more second protruding units 120 may be provided to disperse the stress of the second bending area 2B better. Therefore, the shapes of the second protruding unit 120 and the first protruding unit 110 may be the same or different. Similarly, the shapes or areas of respective second protruding units 120 may be the same or different.

It should be noted that in the above-mentioned embodiment, the binding area 21 and the connector 22 of the flexible circuit board body 2 are respectively arranged at two opposite sides of the rectangular non-bending area A, that is, the first bending area 1B and the second bending areas 2B are arranged oppositely, so that the first edge portion 11 and the second edge portion 12 in the above-mentioned embodiment are arranged at two opposite sides of the central portion 10 to correspond to the two bending areas respectively. In another embodiment, when the binding area 21 and the connector 22 of the flexible circuit board body are respectively arranged at two adjacent sides of the rectangular non-bending area A, that is, the first bending area 1B and the second bending area 2B are arranged adjacently, the first edge portion 11 and the second edge portion 12 of the electromagnetic shielding film should also be correspondingly arranged at two adjacent sides of the central portion 10. Similarly, in the above-mentioned embodiment, the non-bending area A of the flexible circuit board body 2 is rectangular, and the central portion 10 of the corresponding electromagnetic shielding film is also rectangular. In another embodiment, the non-bending area A of the flexible circuit board body 2 may also be of other shapes such as a trapezoid according to a circuit layout, and correspondingly, the central portion 10 of the electromagnetic shielding film 1 is arranged to have a corresponding shape. In this case, the positions of the first bending area 1B and the second bending area 2B are determined by the positions of the binding area 21 and the connector 22, and the first edge portion 11 and the second edge portion 12 of the electromagnetic shielding film 1 are also correspondingly arranged at corresponding side edges.

Generally, the electromagnetic shielding film 1 provided with two edge portions may be attached to the flexible circuit board body 2 with two bending areas. The two edge portions are located on the two bending areas, which may reduce the breaking risk of the flexible circuit board body 2 when the two bending area are bent.

It should be noted that in the present disclosure, the electromagnetic shielding film is divided into the central portion 10, the first edge portion 11 and the second edge portion 12, which is only for the convenience of description and does not mean that the three portions are three independent parts. In fact, the central portion 10, the first edge portion 11 and the second edge portion 12 are connected together, and the entire electromagnetic shielding film is an integral film.

The above embodiments only describe the electromagnetic shielding film with two edge portions as an example. Some flexible circuit board bodies have only one area to be bent, so only one edge portion may be provided at corresponding position of the electromagnetic shielding film. Alternatively, some flexible circuit board bodies may be provided with more bending areas, so more edge portions may be provided at corresponding positions of the electromagnetic shielding film. The specific structure will not be repeated here.

An embodiment of the present disclosure further provides a flexible circuit board. The flexible circuit board includes a flexible circuit board body and at least one electromagnetic shielding film in the above-mentioned embodiments, and the entire flexible circuit board will have a better electromagnetic shielding effect. The specific structures of the flexible circuit board body and the electromagnetic shielding film have been described above, and will not be repeated here.

In an exemplary embodiment, as shown in FIG. 3, the edge portion of the electromagnetic shielding film is located at a side, close to the non-bending area A, of the bending axis 201 of the bending area, that is, the edge portion only covers a small part of the bending area, which may prevent the electromagnetic shielding film 1 from being damaged by excessive bending thereof. When the edge portion of the electromagnetic shielding film includes the first edge portion 11 and the second edge portion 12, the first edge portion 11 is located on the first bending area 1B and is located at a side, close to the non-bending area A, of the bending axis 201 of the first bending area 1B, and the second edge portion 12 is located on the second bending area 2B and is located at a side, close to the non-bending area A, of the bending axis 201 of the second bending area 2B.

Figure 6:
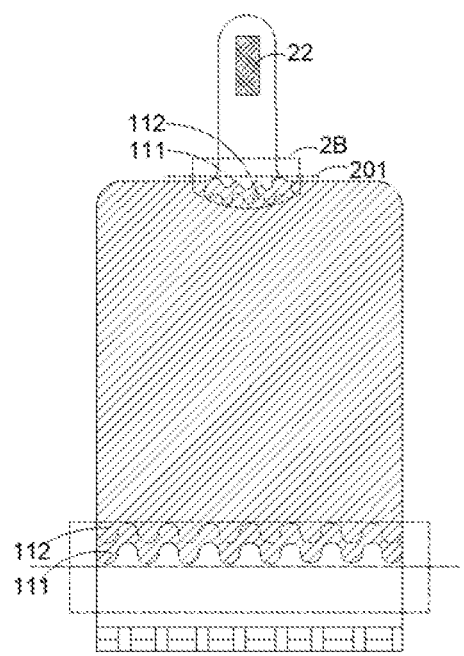
FIG. 6 is a schematic diagram of another structure of a flexible circuit board according to an embodiment of the present disclosure.
Figure 7:
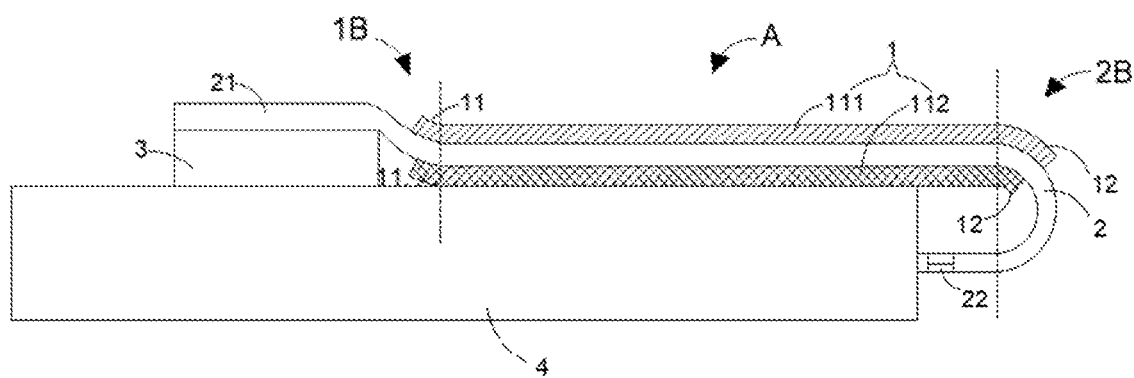
FIG. 7 is another schematic cross-sectional view of a flexible circuit board after being bended according to an embodiment of the present disclosure.

As an optimized design, as shown in FIG. 6 and FIG. 7, the flexible circuit board body 2 usually includes a first surface and a second surface that are arranged oppositely, that is, a front surface and a reverse surface. There are two electromagnetic shielding films 1, which respectively are a first electromagnetic shielding film 111 (shown by a solid line in the figure) and a second electromagnetic shielding film 112 (shown by a dashed line in the figure). When the two surfaces of the flexible circuit board body 2 are both provided with wiring or electrical elements, the first electromagnetic shielding film 111 covers the first surface of the flexible circuit board body 2, and the second electromagnetic shielding film 112 covers the second surface of the flexible circuit board body 2. The two electromagnetic shielding films 1 can shield signal interference on the two surfaces together. The first edge portions 11 of the first electromagnetic shielding film 111 and the second electromagnetic shielding film 112 are both located on the first bending area 1B of the flexible circuit board body 2, and are both located at the side, close to the non-bending area A, of the bending axis 201 of the first bending area 1B, and the second edge portions 12 of the first electromagnetic shielding film 111 and the second electromagnetic shielding film 112 are both located on the second bending area 2B of the flexible circuit board body 2, and are both located at the side, close to the non-bending area A, of the bending axis 201 of the first bending area 1B, so that when the first bending area 1B and the second bending area 2B of the flexible circuit board body 2 are bent, the first edge portions 11 and the second edge portions 12 of the two electromagnetic shielding films all have small stress generated, which reduces the breaking risk of the flexible circuit board body 2, and at the same time, the two electromagnetic shielding films 1 still cover a relatively large area of the flexible circuit board body 2, which may ensure a better shielding effect.

When the flexible circuit board body 2 is covered with two electromagnetic shielding films, the shapes of the two first edge portions 11 of the two electromagnetic shielding films located on the same bending area may be the same or different. For example, as shown in FIG. 6, the shapes of the first protruding units 110 in the first edge portions of the two electromagnetic shielding films are the same. In another embodiment, the shapes of the first protruding units 110 in the two first edge portions may also be different, for example, one has a rectangle shape and the other has a triangle shape. In the same way, the shapes of the two second edge portions 12 of the two electromagnetic shielding films 1 located on the same bending area may be the same or different.

Figure 8:
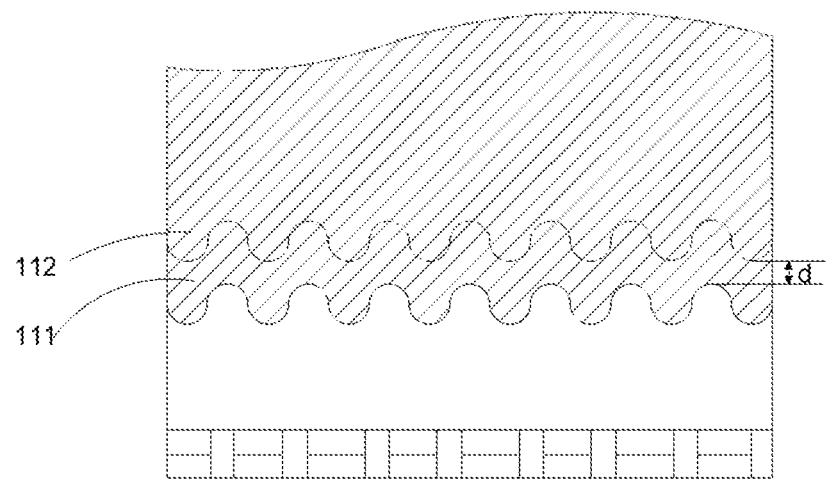
FIG. 8 is a partial enlarged view of FIG. 6.

As shown in FIGS. 7 and 8, in the above embodiment, projections of the first edge portions 11 of the first electromagnetic shielding film 111 and the second electromagnetic shielding film 112 on the flexible circuit board body do not overlap with each other, that is, the two first edge portions 11 are staggered up and down in a vertical direction in the figure, in other words, the first edge portions 11 of the two electromagnetic shielding films are spaced in the vertical direction. Compared with the two edge portions being arranged flush, the staggered structure may reduce a local film thickness offset in the first bending area 1B, and thus may reduce the breaking risk of the flexible circuit board body 2 due to an excessive film thickness offset. Similarly, when both the first electromagnetic shielding film 111 and the second electromagnetic shielding film 112 further include the second edge portions 12, projections of the second edge portions 12 of the first electromagnetic shielding film 111 and the second electromagnetic shielding film 112 on the flexible circuit board body do not overlap with each other, that is, the two first edge portions 12 are staggered up and down in the vertical direction in the figure, in other words, the second edge portions 12 of the two electromagnetic shielding films may also be spaced in the vertical direction.

Preferably, the distance between the first edge portions 11 of the two electromagnetic shielding films is not less than 0.5 mm, and the distance between the second edge portions 12 of the two electromagnetic shielding films is not less than 0.5 mm. It should be noted that the distance between the first edge portions 11 of the two electromagnetic shielding films refers to a distance between two closest points of the two first edge portions 11 in the vertical direction, so as to ensure a good effect of reducing thickness offset.

Similarly, the distance between the second edge portions 12 of the two electromagnetic shielding films refers to a distance between two closest points between the two second edge portions 12 in the vertical direction, for example, the distance d labeled in the figure.

According to the circuit layout, the non-bending area A of the flexible circuit board body 2 may also have other shapes, the positions of the first bending area 1B and the second bending area 2B are determined by the positions of the binding area 21 and the connector 22, and the first edge portion 11 and the second edge portion 12 of the electromagnetic shielding film are also located on the corresponding side edges.

An embodiment of the present disclosure further provides a display device, including the above-mentioned flexible circuit board. Since the flexible circuit board has good bendability and is not easy to break, the performance of the display panel is stable, and an ideal narrow frame design can also be realized, thereby ensuring that the display device has good performance and a large screen-to-body ratio.

The present disclosure does not specifically limit the application of the display device, which may be any product or part that has a display function such as a TV, a laptop, a tablet computer, a wearable display device, a mobile phone, a car display, a navigation, an e-book, a digital photo frame, an advertising light box.

Although relative terms such as "upper" and "lower" are used in this specification to describe the relative relationship between one component and another component shown, these terms are used in this specification only for convenience of description, for example, according to the direction shown in the drawings. It can be understood that if a device shown is turned upside down, the component described as "upper" will become the "lower" component. When a structure is "on" another structure, it may mean that the structure is integrally formed on the another structure, or that the structure is "directly" installed on the another structure, or that the structure is "indirectly" installed on the another structure through a further structure.

The terms "a", "an", "the", "said" and "at least one" are used to indicate the presence of one or more elements/components/etc.; the terms "including" and "have" are used to indicate open-ended inclusive means and means that there may be additional elements/components/etc. in addition to the listed elements/components/etc.

Those skilled in the art will easily conceive of other embodiments of the present disclosure after considering the specification and practicing the present invention disclosed herein. The present disclosure is intended to cover any variations, uses, or adaptive changes of the present disclosure. These variations, uses, or adaptive changes follow the general principles of the present disclosure and include common knowledge or conventional technical means in the technical field that are not disclosed in the present disclosure. The description and the embodiments are only regarded as exemplary, and the true scope and spirit of the present disclosure are pointed out by the appended claims.

What is claimed is:

1. An electromagnetic shielding film, comprising:
a central portion, having a plurality of surrounding side edges; and
an edge portion, provided on at least one side edge of the central portion, and comprising a plurality of protruding units protruding away from the central portion, the plurality of protruding units being arranged in an extending direction of the side edge where the edge portion is located,
wherein the electromagnetic shielding film is flexible, comprises an insulating layer, a metal shielding layer and a conductive adhesive layer, and is configured to shield electromagnetic waves, and
wherein the plurality of protruding units each has a shape of at least one of a triangle, a semicircle, or a semiellipse, and the plurality of protruding units are directly connected with each other in the extending direction of the side edge where the edge portion is located.

2. The electromagnetic shielding film according to claim 1, wherein the central portion comprises a first side edge and a second side edge, and the electromagnetic shielding film comprises a first edge portion and a second edge portion,
the first edge portion is located on the first side edge and comprises a plurality of first protruding units protruding away from the central portion, and the plurality of first protruding units are arranged in an extending direction of the first side edge, and
the second edge portion is located on the second side and comprises a plurality of second protruding units protruding away from the central portion, and the plurality of second protruding units are arranged in an extending direction of the second side edge.

3. The electromagnetic shielding film according to claim 2, wherein shapes or areas of the plurality of first protruding units are same, and shapes or areas of the plurality of second protruding units are same, and the first protruding unit has a same shape or area as that of the second protruding unit.

4. The electromagnetic shielding film according to claim 3, wherein the first protruding unit and the second protruding unit have a shape of a rectangle, a triangle, a semicircle, or a semiellipse.

5. The electromagnetic shielding film according to claim 2, wherein the central portion of the electromagnetic shielding film has a rectangular shape, and the first side edge and the second side edge are arranged opposite to each other.

6. A flexible circuit board, comprising:
a flexible circuit board body, comprising a non-bending area and a bending area located on at least one side edge of the non-bending area; and
at least one electromagnetic shielding film, covering the flexible circuit board body,
wherein the electromagnetic shielding film comprises:
a central portion, having a plurality of surrounding side edges; and
an edge portion, provided on at least one side edge of the central portion, and comprising a plurality of protruding units protruding away from the central portion, the plurality of protruding units being arranged in an extending direction of the side edge where the edge portion is located,
wherein the electromagnetic shielding film is flexible, comprises an insulating layer, a metal shielding layer and a conductive adhesive layer, and is configured to shield electromagnetic waves,
wherein the plurality of protruding units each has a shape of at least one of a triangle, a semicircle, or a semiellipse, and the plurality of protruding units are directly connected with each other in the extending direction of the side edge where the edge portion is located, and
wherein the central portion of the electromagnetic shielding film is located on the non-bending area, and the edge portion of the electromagnetic shielding film is located on the bending area.

7. The flexible circuit board according to claim 6, wherein the edge portion of the electromagnetic shielding film is located at a side, close to the non-bending area, of a bending axis of the bending area.

8. The flexible circuit board according to claim 7, wherein the central portion of the electromagnetic shielding film comprises a first side edge and a second side edge, and the electromagnetic shielding film comprises a first edge portion and a second edge portion; the first edge portion is located on the first side edge and comprises a plurality of first protruding units protruding away from the central portion, and the plurality of first protruding units are arranged in an extending direction of the first side edge; the second edge portion is located on the second side edge and comprises a plurality of second protruding units protruding away from the central portion, and the plurality of second protruding units are arranged in an extending direction of the second side edge; and the flexible circuit board body comprises a first bending area at a side of the non-bending area and a second bending area at another side of the non-bending area, and
wherein the central portion of the electromagnetic shielding film is located on the non-bending area of the flexible circuit board body; the first edge portion of the electromagnetic shielding film is located on the first bending area of the flexible circuit board body and is located at a side, close to the non-bending area, of a bending axis of the first bending area; and the second edge portion of the electromagnetic shielding film is located on the second bending area of the flexible circuit board body and is located at a side, close to the non-bending area, of a bending axis of the second bending area.

9. The flexible circuit board according to claim 8, wherein the flexible circuit board comprises two said electromagnetic shielding films that respectively are a first electromagnetic shielding film and a second electromagnetic shielding film, the flexible circuit board body comprises a first surface and a second surface opposite to each other, the first electromagnetic shielding film covers the first surface of the flexible circuit board body, and the second electromagnetic shielding film covers the second surface of the flexible circuit board body; and
wherein the central portions of the first electromagnetic shielding film and the second electromagnetic shielding film are both located on the non-bending area of the flexible circuit board body, the first edge portions of the first electromagnetic shielding film and the second electromagnetic shielding film are both located on the first bending area and are both located at the side, close to the non-bending area, of the bending axis of the first bending area, and the second edge portions of the first electromagnetic shielding film and the second electromagnetic shielding film are both located on the second bending area and are both located at the side, close to the non-bending area, of the bending axis of the first bending area.

10. The flexible circuit board according to claim 9, wherein a projection of the first edge portion of the first electromagnetic shielding film on the flexible circuit board body does not overlap with a projection of the first edge portion of the second electromagnetic shielding film on the flexible circuit board body, and/or a projection of the second edge portion of the first electromagnetic shielding film on the flexible circuit board body does not overlap with a projection of the second edge portion of the second electromagnetic shielding film on the flexible circuit board body.

11. The flexible circuit board according to claim 9, wherein the non-bending area of the flexible circuit board body, the central portion of the first electromagnetic shielding film, and the central portion of the second electromagnetic shielding portion have a rectangular shape, the first bending area and the second bending area are arranged oppositely, and the first side edge and the second side edge are arranged oppositely.

12. The flexible circuit board according to c claim 9, wherein the first edge portions of the first electromagnetic shielding film and the second electromagnetic shielding film have a same shape and size, and the second edge portions of the first electromagnetic shielding film and the second electromagnetic shielding film have a same shape and size.

13. A display device comprising a flexible circuit board, wherein the flexible circuit board comprises:
a flexible circuit board body, comprising a non-bending area and a bending area located on at least one side edge of the non-bending area; and
at least one electromagnetic shielding film, covering the flexible circuit board body,
wherein the electromagnetic shielding film comprises:
a central portion, having a plurality of surrounding side edges; and
an edge portion, provided on at least one side edge of the central portion, and comprising a plurality of protruding units protruding away from the central portion, the plurality of protruding units being arranged in an extending direction of the side edge where the edge portion is located, wherein the electromagnetic shielding film is flexible, comprises an insulating layer, a metal shielding layer and a conductive adhesive layer, and is configured to shield electromagnetic waves, wherein the plurality of protruding units each has a shape of at least one of a triangle, a semicircle, or a semiellipse, and the plurality of protruding units are directly connected with each other in the extending direction of the side edge where the edge portion is located, and wherein the central portion of the electromagnetic shielding film is located on the non-bending area, and the edge portion of the electromagnetic shielding film is located on the bending area.

14. The display device according to claim 13, wherein the edge portion of the electromagnetic shielding film is located at a side, close to the non-bending area, of a bending axis of the bending area.

15. The display device according to claim 14, wherein the central portion of the electromagnetic shielding film comprises a first side edge and a second side edge, and the electromagnetic shielding film comprises a first edge portion and a second edge portion; the first edge portion is located on the first side edge and comprises a plurality of first protruding units protruding away from the central portion, and the plurality of first protruding units are arranged in an extending direction of the first side edge; the second edge portion is located on the second side edge and comprises a plurality of second protruding units protruding away from the central portion, and the plurality of second protruding units are arranged in an extending direction of the second side edge; and the flexible circuit board body comprises a first bending area at a side of the non-bending area and a second bending area at another side of the non-bending area, and wherein the central portion of the electromagnetic shielding film is located on the non-bending area of the flexible circuit board body; the first edge portion of the electromagnetic shielding film is located on the first bending area of the flexible circuit board body and is located at a side, close to the non-bending area, of a bending axis of the first bending area; and the second edge portion of the electromagnetic shielding film is located on the second bending area of the flexible circuit board body and is located at a side, close to the non-bending area, of a bending axis of the second bending area.

16. The display device according to claim 15, wherein the flexible circuit board comprises two said electromagnetic shielding films that respectively are a first electromagnetic shielding film and a second electromagnetic shielding film, the flexible circuit board body comprises a first surface and a second surface opposite to each other, the first electromagnetic shielding film covers the first surface of the flexible circuit board body, and the second electromagnetic shielding film covers the second surface of the flexible circuit board body; and wherein the central portions of the first electromagnetic shielding film and the second electromagnetic shielding film are both located on the non-bending area of the flexible circuit board body, the first edge portions of the first electromagnetic shielding film and the second electromagnetic shielding film are both located on the first bending area and are both located at the side, close to the non-bending area, of the bending axis of the first bending area, and the second edge portions of the first electromagnetic shielding film and the second electromagnetic shielding film are both located on the second bending area and are both located at the side, close to the non-bending area, of the bending axis of the first bending area.

17. The display device according to claim 16, wherein a projection of the first edge portion of the first electromagnetic shielding film on the flexible circuit board body does not overlap with a projection of the first edge portion of the second electromagnetic shielding film on the flexible circuit board body, and/or a projection of the second edge portion of the first electromagnetic shielding film on the flexible circuit board body does not overlap with a projection of the second edge portion of the second electromagnetic shielding film on the flexible circuit board body.

18. The display device according to claim 16, wherein the non-bending area of the flexible circuit board body, the central portion of the first electromagnetic shielding film, and the central portion of the second electromagnetic shielding portion have a rectangular shape, the first bending area and the second bending area are arranged oppositely, and the first side edge and the second side edge are arranged oppositely.

19. The display device according to claim 16, wherein the first edge portions of the first electromagnetic shielding film and the second electromagnetic shielding film have a same shape and size, and the second edge portions of the first electromagnetic shielding film and the second electromagnetic shielding film have a same shape and size.

20. The electromagnetic shielding film according to claim 2, wherein shapes or areas of the plurality of first protruding units are different from each other, and shapes or areas of the plurality of second protruding units are different from each other, and the first protruding unit has a different shape or area from that of the second protruding unit.

* * * * *